US012765300B2

(12) United States Patent
Kim et al.

(10) Patent No.: US 12,765,300 B2
(45) Date of Patent: Oct. 13, 2026

(54) WAFER DICING METHOD FORMING INTERNAL CRACKS BY LASER BEAM AND METHOD OF MANUFACTURING SEMICONDUCTOR DEVICE BY USING THE SAME

(71) Applicant: Samsung Electronics Co., Ltd., Suwon-si (KR)

(72) Inventors: Jesung Kim, Suwon-si (KR); Haemin Park, Suwon-si (KR); Heejae Nam, Suwon-si (KR); Junggeun Shin, Suwon-si (KR); Junho Yoon, Suwon-si (KR); Jungho Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 302 days.

(21) Appl. No.: 18/519,501

(22) Filed: Nov. 27, 2023

(65) Prior Publication Data

US 2024/0178000 A1 May 30, 2024

(30) Foreign Application Priority Data

Nov. 28, 2022 (KR) ........................ 10-2022-0162032

(51) Int. Cl.
*H10P 54/30* (2026.01)
*B23K 26/53* (2014.01)
(Continued)

(52) U.S. Cl.
CPC .............. *H10P 54/30* (2026.01); *B23K 26/53* (2015.10); *H10P 52/00* (2026.01); *H10P 54/00* (2026.01);
(Continued)

(58) Field of Classification Search
CPC .... B23K 26/362; B23K 26/364; B23K 26/53; H01L 23/562; H10P 52/00; H10P 52/202;
(Continued)

(56) References Cited

U.S. PATENT DOCUMENTS 7,064,010 B2 6/2006 Farnworth et al.
10,468,255 B2 11/2019 Zhao
(Continued)

FOREIGN PATENT DOCUMENTS

JP 2007173475 A 7/2007
JP 6401993 B2 9/2018
(Continued)

*Primary Examiner* — Cheung Lee
(74) *Attorney, Agent, or Firm* — Wolf, Greenfield & Sacks, P.C.

(57) ABSTRACT

A wafer dicing method includes preparing a wafer having a plurality of device formation areas and a scribe lane area defining the plurality of device formation areas, forming a plurality of semiconductor devices in the plurality of device formation areas of the wafer, forming, in the scribe lane area, a plurality of first grooves partially passing through at least a portion of the wafer in a vertical direction, forming a plurality of second grooves by planarizing lower surfaces of the plurality of first grooves, forming one or more internal cracks in the wafer by radiating a laser beam along lower surfaces of the plurality of second grooves, and separating the plurality of semiconductor devices from each other along the one or more internal cracks.

20 Claims, 9 Drawing Sheets

(51) Int. Cl.

| | |
|---|---|
| ***H10P 52/00*** | (2026.01) |
| ***H10P 54/00*** | (2026.01) |
| ***H10P 58/00*** | (2026.01) |
| ***H10P 72/70*** | (2026.01) |
| *B23K 101/40* | (2006.01) |

(52) U.S. Cl.
CPC .......... *H10P 58/20* (2026.01); *H10P 72/7402* (2026.01); *B23K 2101/40* (2018.08); *H10P 72/7416* (2026.01)

(58) Field of Classification Search
CPC .. H10P 52/40; H10P 52/402; H10P 54/00–94; H10P 54/20; H10P 54/30; H10P 54/92; H10P 58/00; H10P 58/20; H10P 58/22; H10P 72/7402; H10P 72/7404; H10P 72/7406; H10P 72/7416
See application file for complete search history.

(56) References Cited

U.S. PATENT DOCUMENTS

| | | | | |
|---|---|---|---|---|
| 10,796,962 | B2 | 10/2020 | Wakahara et al. | |
| 2007/0141810 | A1 | 6/2007 | Nakamura | |
| 2011/0081768 | A1 * | 4/2011 | Nakamura | H10P 72/0428 257/E21.599 |
| 2019/0304838 | A1 * | 10/2019 | Saeki | H10P 54/00 |
| 2020/0122275 | A1 | 4/2020 | Sakamoto | |
| 2022/0288722 | A1 * | 9/2022 | Hashimoto | B23K 26/364 |

FOREIGN PATENT DOCUMENTS

| | | | |
|---|---|---|---|
| JP | 6634300 | B2 | 12/2019 |
| JP | 2022-161135 | A | 10/2022 |
| KR | 101962754 | B1 | 3/2019 |
| KR | 10-2022-0005188 | A | 1/2022 |

* cited by examiner

S200a

WAFER DICING METHOD FORMING INTERNAL CRACKS BY LASER BEAM AND METHOD OF MANUFACTURING SEMICONDUCTOR DEVICE BY USING THE SAME

CROSS-REFERENCE TO RELATED APPLICATION

This application is based on and claims priority under 35 U.S.C. § 119 to Korean Patent Application No. 10-2022-0162032, filed on Nov. 28, 2022, in the Korean Intellectual Property Office, the disclosure of which is incorporated by reference herein in its entirety.

BACKGROUND

The inventive concept relates to a wafer dicing method and a method of manufacturing a semiconductor device by using the wafer dicing method, and more particularly, to a wafer dicing method in which a stealth dicing process is performed, and a method of manufacturing a semiconductor device by using the wafer dicing method.

A laser processing process may refer to a process of processing a shape or physical property of a surface of a workpiece by scanning a laser beam onto the surface of the workpiece. For example, the laser processing process includes a patterning process for forming a pattern on a surface of a workpiece, a process of modifying a property of a workpiece, such as wafer annealing, a molding process for changing a shape of a workpiece through heating and melting, and a breaking process for breaking a workpiece into a plurality of units through heating and melting.

In a wafer dicing method using a laser beam, a workpiece may be broken by heating and melting the workpiece by irradiating the workpiece with laser light of a wavelength band having a high absorption rate. When a wafer is melted and broken, not only the broken area but also the surrounding area is melted, causing damage to part of a semiconductor device formed on the wafer.

To resolve this, a stealth dicing process may be used to induce internal cracks by focusing a laser beam on the inside of the wafer.

SUMMARY

The inventive concept provides a wafer dicing method with improved reliability, and a method of manufacturing a semiconductor device by using the wafer dicing method.

According to an embodiment of the inventive concept, a wafer dicing method includes preparing a wafer having a plurality of device formation areas and a scribe lane area defining the plurality of device formation areas, forming a plurality of semiconductor devices in the plurality of device formation areas of the wafer, forming, in the scribe lane area, a plurality of first grooves partially passing through at least a portion of the wafer in a vertical direction, forming a plurality of second grooves by planarizing lower surfaces of the plurality of first grooves, forming one or more internal cracks in the wafer by radiating a laser beam along lower surfaces of the plurality of second grooves, and separating the plurality of semiconductor devices from each other along the one or more internal cracks.

According to an embodiment of the inventive concept, a method of manufacturing a semiconductor device includes preparing a wafer having a plurality of device formation areas and a scribe lane area defining the plurality of device formation areas, forming a plurality of semiconductor devices in the plurality of device formation areas of the wafer, forming a plurality of insulating layers and a wiring layer on the wafer, forming, in the scribe lane area, a plurality of first grooves partially passing through at least a portion of the wafer in a vertical direction, forming a plurality of second grooves by planarizing lower surfaces of the plurality of first grooves, forming one or more internal cracks in the wafer by radiating a laser beam along lower surfaces of the plurality of second grooves, separating the plurality of semiconductor devices from each other along the one or more internal cracks, and packaging each of the plurality of separated semiconductor devices, wherein the plurality of first grooves are formed to pass through at least one of the plurality of insulating layers and the wiring layer in the vertical direction.

According to an embodiment of the inventive concept, a method of manufacturing a semiconductor device includes preparing a plurality of device formation areas and a scribe lane area defining the plurality of device formation areas, forming a plurality of semiconductor devices in the plurality of device formation areas of the wafer, forming a plurality of insulating layers and a wiring layer on the wafer, forming, in the scribe lane area, a plurality of first grooves partially passing through at least a portion of the wafer in a vertical direction, forming a plurality of second grooves by planarizing lower surfaces of the plurality of first grooves, forming one or more internal cracks in the wafer by irradiating the scribe lane area with a laser beam along lower surfaces of the plurality of second grooves, separating the plurality of semiconductor devices from each other along the one or more internal cracks, and packaging each of the plurality of separated semiconductor devices, wherein the forming of the plurality of first grooves in the scribe lane area includes performing at least one of a laser etching method using a first laser device, and a plasma etching method, the planarizing of the lower surfaces of the plurality of first grooves includes performing at least one of a laser etching method using a second laser device, and a chemical mechanical polish (CMP) method, the forming of the one or more internal cracks includes performing a laser etching method using a third laser device, and the plurality of first grooves are formed to pass through at least one of the plurality of insulating layers and the wiring layer in the vertical direction.

BRIEF DESCRIPTION OF THE DRAWINGS

Embodiments will be more clearly understood from the following detailed description taken in conjunction with the accompanying drawings, wherein like reference numerals (when used) indicate corresponding elements throughout the several views, and in which.

DETAILED DESCRIPTION OF PREFERRED EMBODIMENTS

Figure 1:
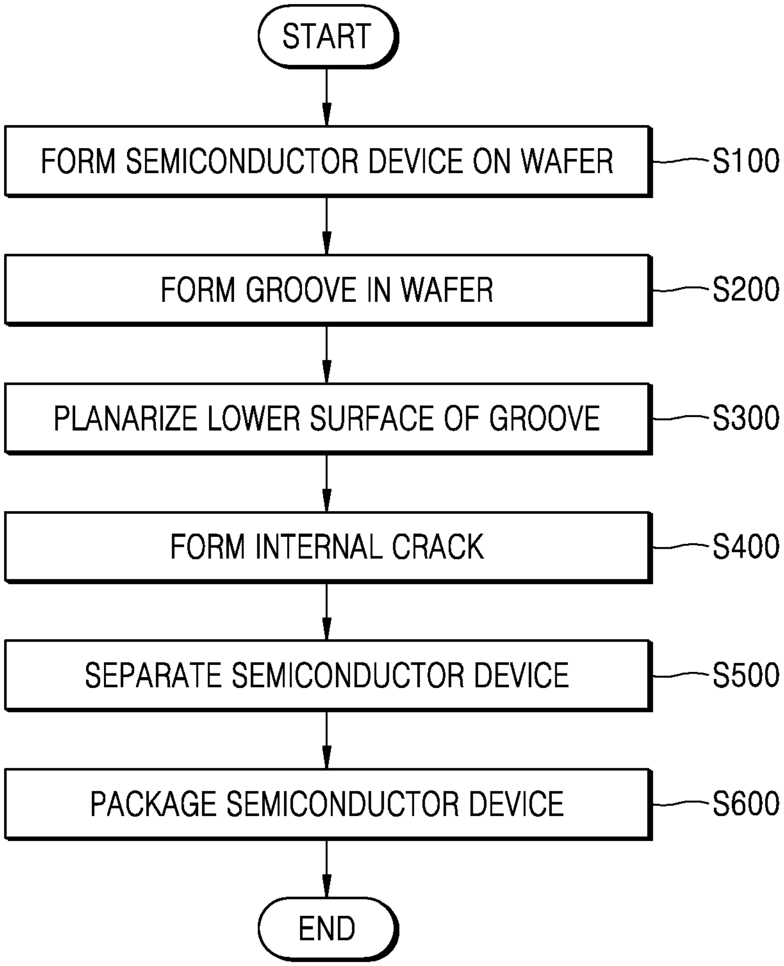
FIG. 1 is a flowchart of a method of manufacturing a semiconductor device, according to an embodiment of the inventive concept.

Hereinafter, embodiments of the inventive concept are described in detail with reference to the accompanying drawings. In the drawings, the same reference symbols are used to indicate the same device, and redundant descriptions thereof are omitted.

FIG. 1 is a flowchart of a method of manufacturing a semiconductor device, according to an embodiment of the inventive concept. FIGS. 2A to 2E are cross-sectional views for describing intermediate processes in an exemplary method of manufacturing a semiconductor device, according to an embodiment of the inventive concept. For convenience of description, in FIGS. 2A to 2E, a scribe lane area SL is arranged only between two semiconductor devices SD, although it is to be appreciated that the scribe lane area SL need not exist merely between two adjacent semiconductor devices.

Figure 2A:
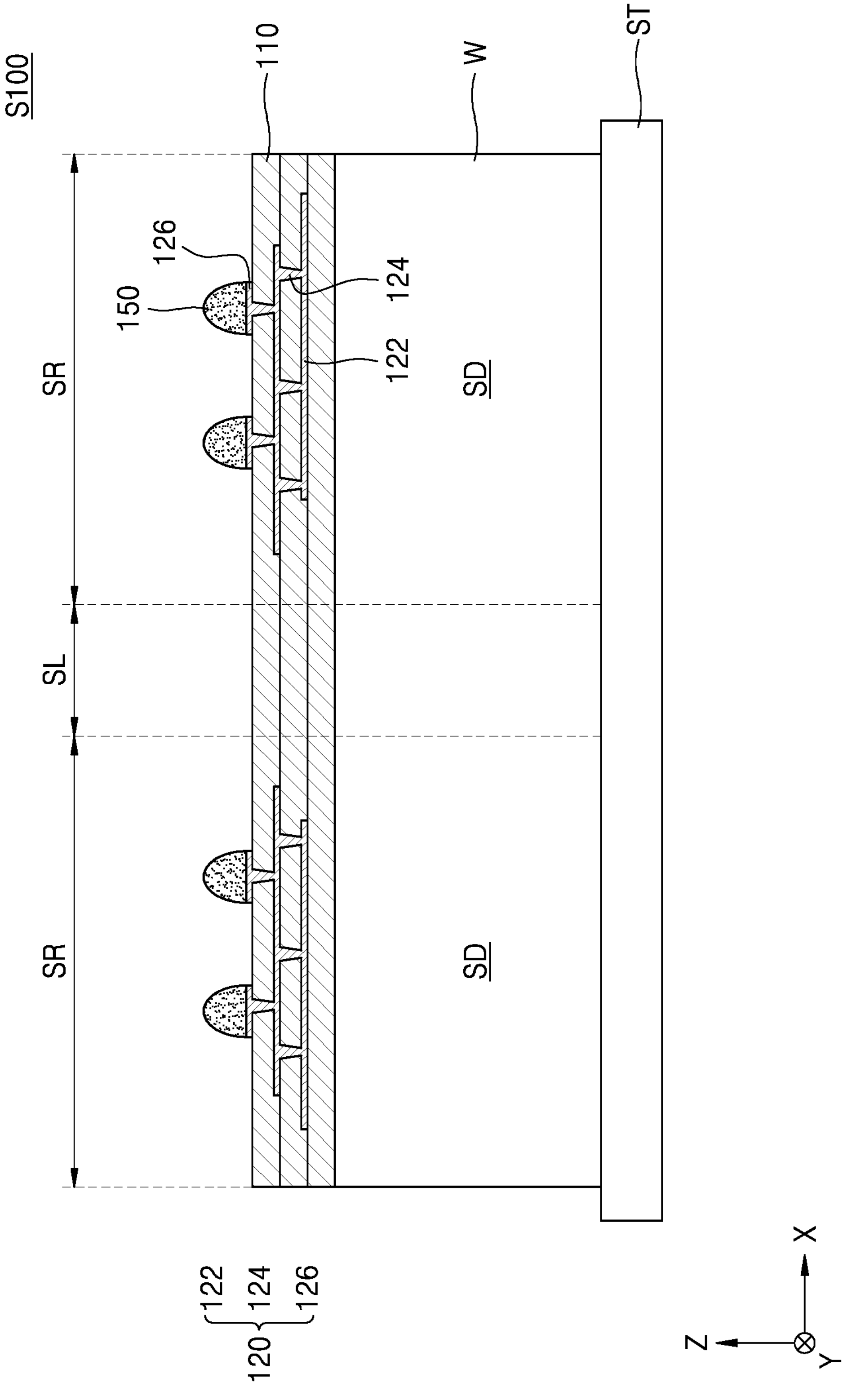
FIGS. 2A to 2E are cross-sectional views illustrating intermediate processes in an exemplary method of manufacturing a semiconductor device, according to an embodiment of the inventive concept.

Referring to FIGS. 1 and 2A together, a plurality of semiconductor devices SD may be formed on a wafer W, in operation S100. The wafer W may include a plurality of device formation areas SR in which the plurality of semiconductor devices SD are respectively formed, and the scribe lane area SL laterally between and defining the plurality of device formation areas SR.

The wafer W may include, for example, silicon (Si). The wafer W may include a semiconductor element, such as germanium (Ge), and a compound semiconductor, such as silicon carbide (SiC), gallium arsenide (GaAs), indium arsenide (InAs), and indium phosphide (InP). It is to be appreciated that embodiments of the inventive concept are not limited to the specific type of material used in forming the wafer W.

In some embodiments, the wafer W may have a silicon-on-insulator (SOI) structure. The wafer W may include a buried oxide layer on the front surface thereof. In some embodiments, the wafer W may include a conductive area formed on the front surface of the wafer W, for example, a well doped with impurities. In some embodiments, the wafer W may have various device isolation structures, such as, for example, a shallow trench isolation (STI) for isolating doped wells from each other, or a local oxidation of silicon (LOCOS) area for isolating adjacent transistors or other circuit elements. Although not shown, a plurality of material layers may be formed on the front surface of the wafer W. At least one material layer may be formed on a back surface of the wafer W.

The semiconductor device SD formed in the wafer W may be any of a memory device and a non-memory device. In some embodiments, the memory device may be a non-volatile memory semiconductor device, such as flash memory, phase-change random access memory (PRAM), magnetoresistive random access memory (MRAM), ferroelectric random access memory (FeRAM), or resistive random access memory (RRAM). The flash memory may be, for example, a vertical not AND (V-NAND) flash memory. In some other embodiments, the memory device may be a volatile memory semiconductor device, such as dynamic random access memory (DRAM) or static random access memory (SRAM). The memory device may be a volatile memory device that loses data when power is cut off. In some embodiments, the non-memory device may be a logic chip, such as a central processing unit (CPU), a graphics processing unit (GPU), or an application processor (AP). In some embodiments, the non-memory device may be a measuring device, a communication device, a digital signal processor (DSP), or a system-on-chip (SoC).

Although the overall fabrication method(s) and the structures formed thereby are entirely novel, certain individual processing steps required to implement the method may utilize some conventional semiconductor fabrication techniques and conventional semiconductor fabrication tooling. These techniques and tooling will already be familiar to those having ordinary skill in the relevant art. For example, a process of forming the semiconductor device SD may be an oxidation process for forming an oxide layer, a lithography process including spin coating, exposure, and development, a thin-film deposition process, a dry or wet etching process, and a metal wiring process.

The oxidation process is a process of forming a thin and uniform silicon oxide layer by chemically reacting oxygen or water vapor with a surface of a silicon substrate at a high temperature of about 800° C. to about 1200° C. The oxidation process may include dry oxidation and wet oxidation. The dry oxidation may form an oxide layer by reacting with oxygen gas, and the wet oxidation may form an oxide layer by reacting oxygen and water vapor with each other.

The lithography process is a process of transferring a circuit pattern pre-formed on a lithography mask onto a substrate through exposure. The lithography process may be performed in an order of spin coating, exposure, and a development process.

For example, the thin-film deposition process may be any of atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy, and direct current (DC) magnetron sputtering.

For example, the dry etching process may be any of reactive ion etching (RIE), deep RIE (DRIE), ion beam etching (IBE), and argon (Ar) milling. In another example, the dry etching process that may be performed on the wafer W may be atomic layer etching (ALE). In addition, the dry etching process that may be performed on the wafer W may use at least one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $O_2$, $SO_2$, and COS, as etchant gas. The phrase "at least one of A, B and C," the format of which may be used and extended throughout the present application, is intended to mean A alone, B alone, C alone, or any combination of A, B and/or C (e.g., A and B, A and C, B and C, or A and B and C).

The metal wiring process may be a process of forming a conductive wiring (metal line) to implement a circuit pattern for an operation of the semiconductor device SD. Through the metal wiring process, electrical transfer paths of ground, power, and signals for operating the semiconductor device SD may be formed. The metal wiring may include at least one metal element from among gold (Au), platinum (Pt), silver (Ag), copper (Cu), aluminum (Al), titanium (Ti), tantalum (Ta), and tungsten (W).

In some embodiments, in the process of forming the semiconductor device SD, a planarization process, such as a chemical mechanical polish (CMP) process or an etchback process, or an ion implantation process may also be performed.

The wafer W may be disposed on a stage ST. The stage ST may support the wafer W processed by using a laser. In some embodiments, the stage ST may be a vacuum chuck configured to support the wafer W by using vacuum pressure.

Alternatively, the stage ST may be an electrostatic chuck configured to support the wafer W by using electrostatic force, or a chuck including a clamp means for physically supporting the wafer W.

The stage ST may include a stage driving unit (not explicitly shown, but implied) for moving and rotating the stage ST. While the wafer W is processed by using a laser, the stage ST may be configured to move and/or rotate in a state in which the wafer W is supported by an actuator included in the stage driving unit.

As a non-limiting example, FIGS. 2A to 2E show that a plurality of insulating layers 110 and a wiring layer 120 are formed on the wafer W.

The plurality of insulating layers 110 may be disposed on the plurality of device formation areas SR and the scribe lane area SL. For example, the plurality of insulating layers 110 may surround at least part of the wiring layer 120. Each of the plurality of insulating layers 110 may include, for example, an insulating polymer, an epoxy, or a combination thereof. Each of the plurality of insulating layers 110 may be formed from a material layer including an organic polymer material. Alternatively, each of the plurality of insulating layers 110 may include an oxide or nitride. For example, each of the plurality of insulating layers 110 may include a silicon nitride. The plurality of insulating layers 110 may include the same materials as each other, or may include different materials from each other.

According to an embodiment of the inventive concept, the plurality of insulating layers 110 may include, for example, a low-k material or tetraethyl orthosilicate (TEOS). The low-k material may include a material having a lower dielectric constant than silicon oxide ($SiO_2$). For example, the low-k material may include carbon (C), fluorine (F), boron (B), and/or a combination thereof.

For example, the wiring layer 120 may include a redistribution layer. For example, the wiring layer 120 may include Cu and/or Al. The wiring layer 120 may be disposed on the plurality of device formation areas SR. For example, at least a portion of the wiring layer 120 may be covered by one or more of the plurality of insulating layers 110.

As a non-limiting example, FIGS. 2A to 2E show a case in which the wiring layer 120 is a redistribution pattern 120. The plurality of redistribution patterns 120 may include a redistribution line 122, a conductive via 124, and a redistribution pad 126. For example, the plurality of distribution patterns 120 may be metals, such as Cu, Al, W. Ti, Ta, indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof, but are not limited thereto. The elements forming the redistribution patterns 120 (e.g., redistribution line 122, conductive via 124, and redistribution pad 126) may be formed of the same material or, alternatively, may comprise different materials from one another.

The redistribution line 122 may extend in a horizontal direction (X direction and/or Y direction), and the conductive via 124 may extend in a vertical direction (Z direction). The redistribution line 122 and the conductive via 124 may be configured to transfer an electrical signal and/or heat. The redistribution pad 126 may be disposed on insulating layers 110 and may electrically connect the redistribution line 122 and the conductive via 124 to an external connection terminal 150. For example, the redistribution pad 126 may be an under bump metallization (UBM). For example, the external connection terminal 150 may be a solder ball or a solder bump.

Herein, a direction parallel to an extension direction of a main surface of the wafer W may be defined as a horizontal direction (X direction and/or Y direction), and a direction perpendicular to the horizontal direction (X direction and/or Y direction) may be defined as a vertical direction (Z direction).

In another embodiment, the external connection terminal 150 may be attached after a second dicing operation.

Figure 2B:
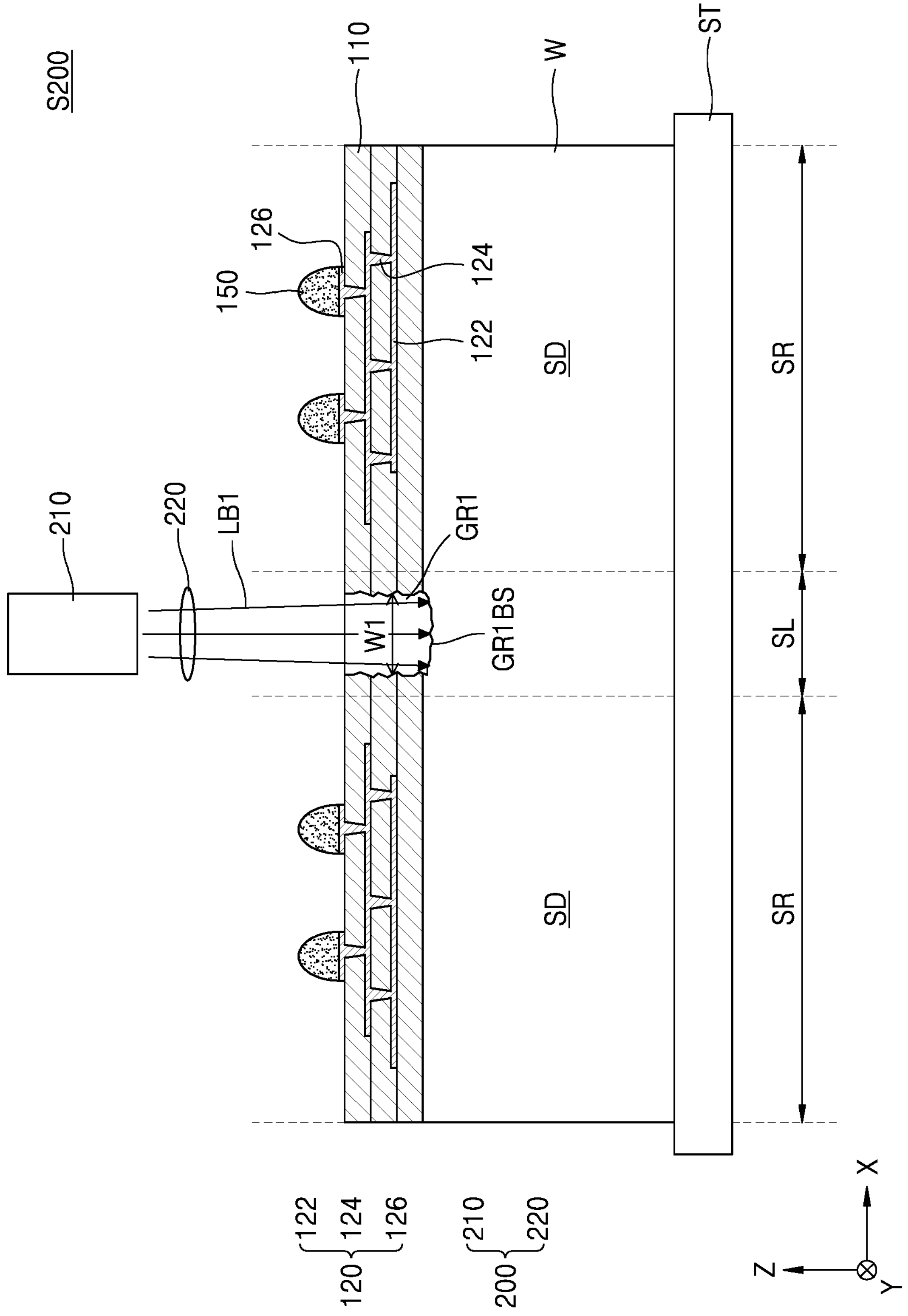

Referring to FIGS. 1 and 2B together, a plurality of first grooves GR1 may be formed in the wafer W, in operation S200. The plurality of first grooves GR1 may be formed in the scribe lane area SL.

The operation of forming the plurality of first grooves GR1 in the wafer W may be referred to as a first dicing operation. In the first dicing operation, the wafer W is not completely broken to separate one wafer W into a plurality of wafers W (e.g., singulated dies). The first dicing operation described above may be referred to as half-dicing because only part of the wafer W is removed.

The plurality of first grooves GR1 may be generated by a first laser device 200. The plurality of first grooves GR1 may be formed by passing through the plurality of insulating layers 110 and/or at least part of the wafer W in the vertical direction (Z direction). A front surface of the wafer W may be partially exposed through the plurality of first grooves GR1. The plurality of first grooves GR1 may be arranged to be adjacent to the front surface of the wafer W. In other words, the first laser device 200 may radiate a first laser beam LB1 adjacent to the front surface of the wafer W. For example, through the first dicing operation, the plurality of insulating layers 110 and the at least part of the wafer W may be removed. In addition, the first dicing operation may include removing other materials, such as a metal pattern, covering the plurality of insulating layers 110 in addition to the plurality of insulating layers 110.

For example, a first width W1, which is a width of each of the plurality of first grooves GR1, may be about 10 micrometers to about 100 micrometers, but is not limited to any specific width. For example, the first width W1 may be greater than or equal to about 50 micrometers.

The first laser device 200 may generate and emit the first laser beam LB1 of a wavelength having absorptivity with respect to the wafer W and the plurality of insulating layers 110. For example, the first laser beam LB1 may include a laser beam having a wavelength of an ultraviolet band.

The first laser device 200 may include a first light source 210 and a first condensation optical system 220 (e.g., collimator, lens, etc.). The first light source 210 may generate and emit the first laser beam LB1. The first laser device 200 may include one or more laser light sources. The first laser beam LB1 emitted from the first light source 210 may reach the first condensation optical system 220. The first condensation optical system 220 may condense (i.e., focus) the first laser beam LB1 inside the wafer W. The first condensation optical system 220 may be configured to be connected to a predetermined actuator (not explicitly shown, but implied) and move, so that a position of a condensing (i.e., focal) point at which the first laser beam LB1 is focused inside the wafer W may be controlled.

The first laser device 200 may be configured to break the wafer W while moving the first laser beam LB1 along the scribe lane area SL of the wafer W. For example, the first laser beam LB1 is radiated onto the wafer W in a state in which the first laser device 200 is fixed, and the stage ST may move in a horizontal direction (for example, X direction and/or Y direction) so that the first laser beam LB1 is radiated along the scribe lane area SL of the wafer W.

Alternatively, in a state in which the stage ST is fixed, the first laser device 200 may emit the first laser beam LB1 to the wafer W while moving in a horizontal direction (for example, X direction and/or Y direction) along the scribe lane area SL of the wafer W. Also, in order to break the wafer W along the scribe lane area SL of the wafer W, a movement of the first laser device 200 and a movement of the stage ST may be performed concurrently.

When the insulating layer 110 includes a low-k material, a strength of the insulating layer 110 may be less than a strength of Si included in the wafer W. The term "strength" as used herein is intended to broadly refer to the ability of a material to resist deformation (e.g., plastic strain) under a load. The mechanical strength of a material is typically considered based on a maximum load that can be borne before failure occurs, taking into account stresses and strains. Accordingly, when the plurality of first grooves GR1 are formed and the wafer W and the insulating layer 110 are cut using a physical method, the insulating layer 110 may be delaminated. Thus, instead of using a physical method, the first laser device 200 may be used to cut the insulating layer 110 and form the plurality of first grooves GR1. Because the plurality of first grooves GR1 are formed, at least part of an upper surface of the wafer W may be exposed.

For example, lower surfaces GR1BS of the plurality of first grooves GR1 may be at a vertical level lower than the top surface of the wafer W. The upper surface of the wafer W may have a concavo-convex shape. Herein, the upper surface of the wafer W may denote a front surface of the wafer W on which the semiconductor device SD is formed, and a lower surface of the wafer W may denote a surface opposite to the upper surface of the wafer W. In addition, a lower surface of an element disposed on the wafer W may denote a surface closer to the upper surface of the wafer W from among two surfaces facing each other in a vertical direction (Z direction). However, lower surfaces GR1BS of the plurality of first grooves GR1 may have a relatively high surface roughness (Ra).

Surface roughness Ra may provide a general measure of the height of the texture across a surface (measured in a Z direction). More particularly, surface roughness Ra may be defined as an average of how far each point on the surface deviates in height from a mean height.

Immediately after the first dicing operation is performed, a cleaning process using deionized (DI) water or the like may be further performed.

Figure 2C:
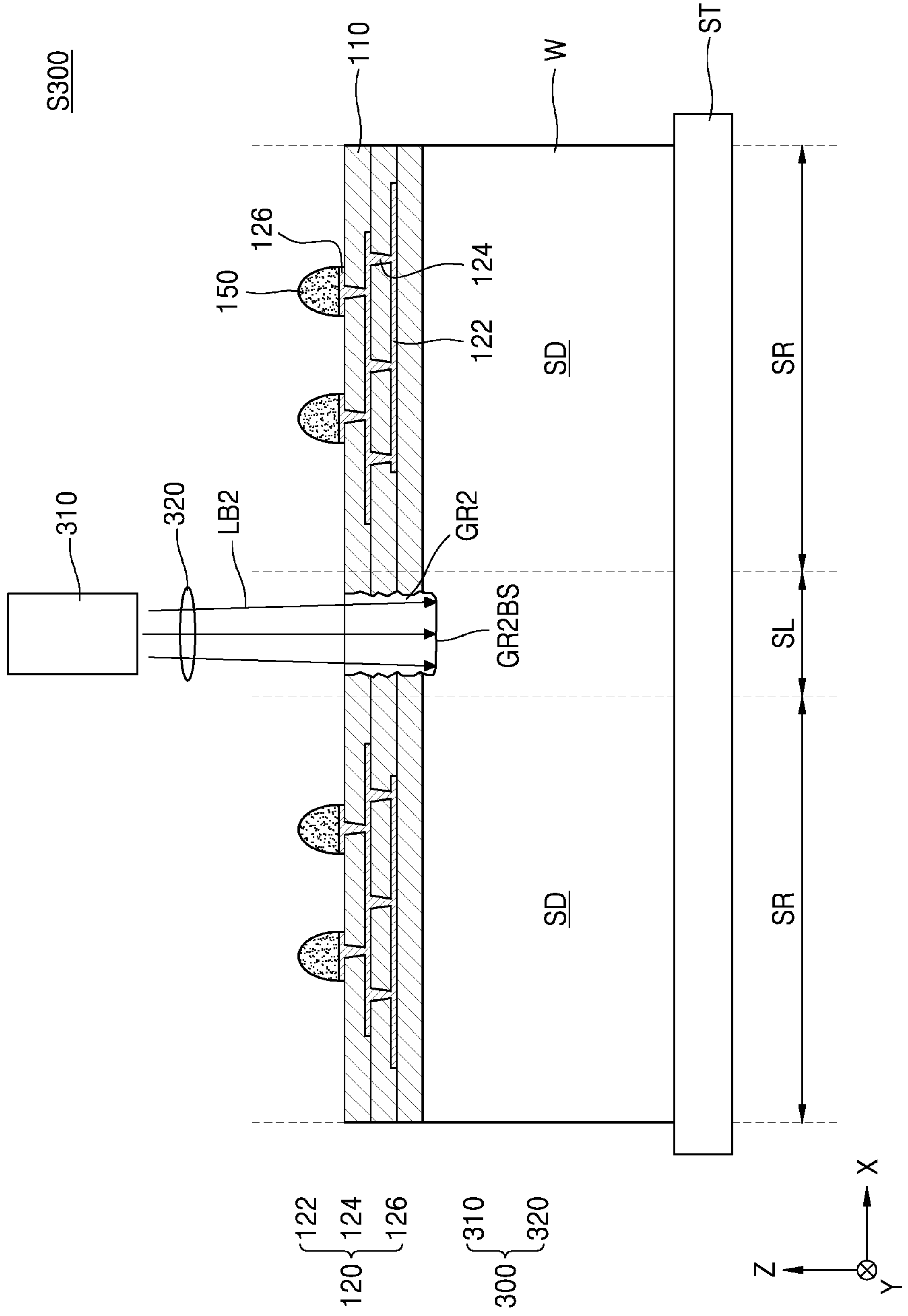

Referring to FIGS. 1 and 2C together, the lower surfaces GR1BS of the plurality of first grooves GR1 may be planarized, in operation S300. For example, using a second laser device, the lower surfaces GR1BS of the plurality of first grooves GR1 (see FIG. 2B) may be planarized. For example, roughness (Ra) of a lower surface of each of a plurality of second grooves GR2 formed by planarizing the lower surface GR1BS of the first groove GR1 may be less than or equal to about 0.08 micrometers, in one or more embodiments. The second laser device may planarize the lower surfaces GR1BS of the plurality of first grooves GR1 until the lower surface of each of the plurality of second grooves GR2 has roughness (Ra) of less than or equal to about 0.08 micrometers.

A second laser device 300 may generate and emit a second laser beam LB2. The second laser device 300 may radiate the second laser beam LB2 adjacent to the front surface of the wafer W. The second laser device 300 may radiate the second laser beam LB2 to the lower surfaces GR1BS of the plurality of first grooves GR1 (see FIG. 2B) and etch at least part of the wafer W in a vertical direction (Z direction). For example, during the operation of planarizing the lower surfaces GR1BS of the plurality of first grooves GR1, the second laser device 300 may etch the wafer W by more than about 1 micrometer in the vertical direction (Z direction). In other words, a lower surface GR2BS of the second grooves GR2 may be located at a vertical level lower than the lower surface GR1BS of the first grooves GR1 by about 1 micrometer.

The second laser device 300 may include a second light source 310 and a second condensation optical system 320. The second light source 310 and the second condensation optical system 320 may be approximately similar to the first light source 210 and the first condensation optical system 220, respectively.

Figure 2D:
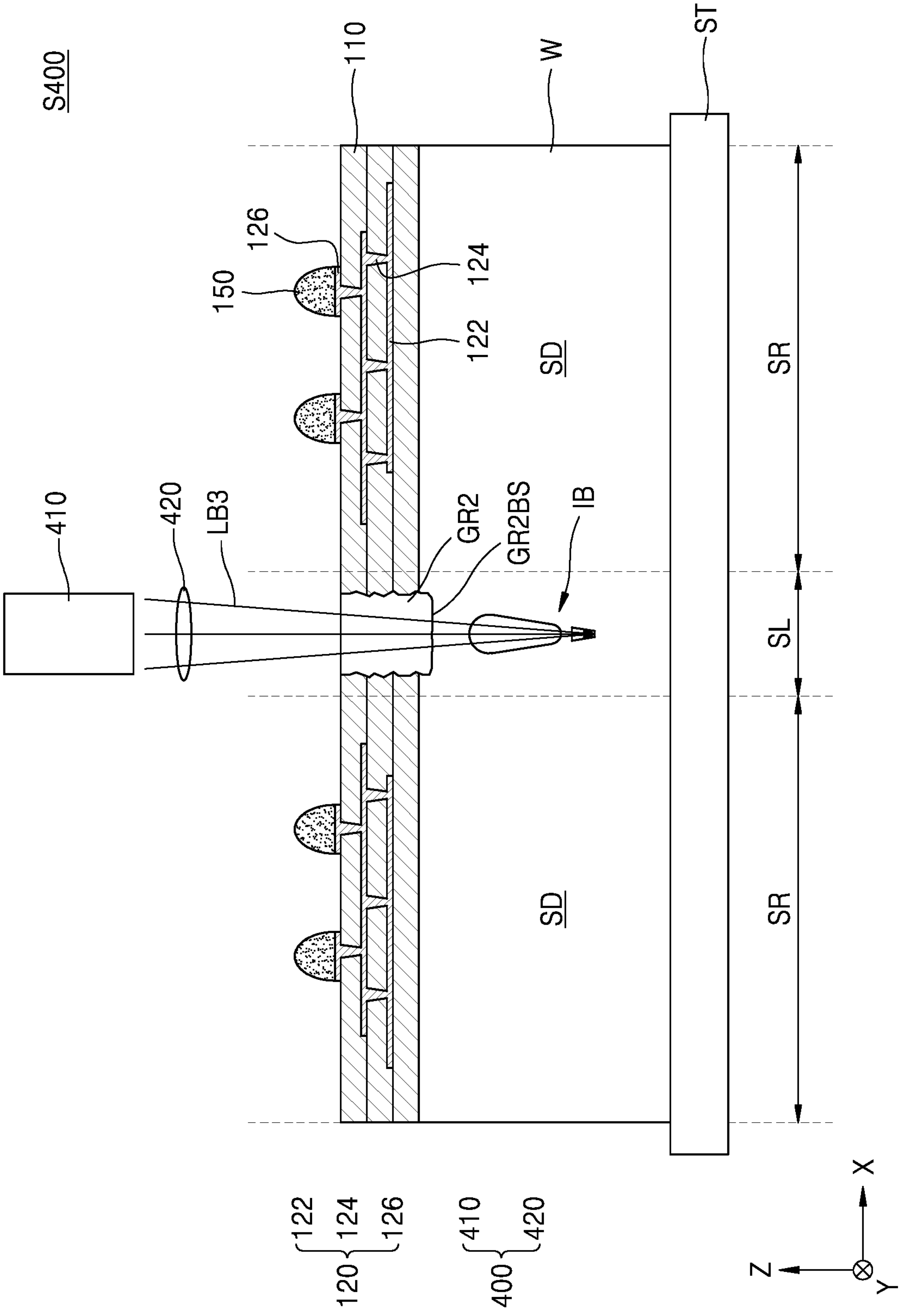

Although described below, when roughness (Ra) of the lower surface GR2BS of each of the plurality of second grooves GR2 is less than or equal to about 0.08 micrometers, it may be easy to perform a stealth dicing process. Stealth dicing is a technology that focuses a laser beam of a prescribed wavelength that permeates through materials, focuses internally and forms a starting point for cracking the wafer W along its scribe lane area SL, then applies external stress to the wafer to separate the individual dies (SD). In more detail, when the roughness (Ra) of the lower surface GR2BS of each of the plurality of second grooves GR2 is less than or equal to about 0.08 micrometers, it may be easy to condense (i.e., focus) laser light on a point or region within (i.e., internal to) the wafer W with a third laser device 400 (FIG. 2D).

Referring to FIGS. 1 and 2B to 2D together, an internal crack IB may be formed in the wafer W, in operation S400. The internal crack IB may be formed in the scribe lane area SL of the wafer W. For example, the internal crack IB may overlap at least one of the plurality of second grooves GR2 in a vertical direction (Z direction). Each of the plurality of internal cracks IB and the plurality of second grooves GR2 in the wafer W may be spaced apart from each other in the vertical direction (Z direction).

The internal crack IB of the wafer W may be formed by a third laser beam LB3 of the third laser device 400. The internal crack IB may have an elongated conical shape in which a width in a vertical direction (Z direction) is greater than a width in a horizontal direction (X direction and/or Y direction). An operation in which the internal crack IB is formed in the wafer W may be referred to as an operation in which a reformed pattern is formed.

The third laser device 400 may include a third light source 410 and a third condensation optical system 420. The third light source 410 may generate and emit the third laser beam LB3. The third condensation optical system 420 may focus the third laser beam LB3 of the third light source 410 at positions set inside the wafer W. The third condensation optical system 420 may include a single lens or a plurality of lenses.

For example, the third laser device 400 may form the internal crack IB within the wafer W by using a stealth dicing technique. Stealth dicing is a process of separating the wafer W on which the semiconductor device SD is formed with high precision and high speed. As previously stated, stealth dicing is a technique of focusing a laser beam of a wavelength band (i.e., a wavelength band in which the wafer W has low absorptivity) in which the laser beam may transmit through a surface of the wafer W to a location inside the wafer W through a surface of the wafer W.

In the stealth dicing technique, a laser beam may be repeatedly radiated with pulses lasting for a very short time (e.g., 1 μs or less), and focused on a narrow area on the wafer W. In other words, the third laser beam LB3 may have a high peak power density, for example, about $1\times10^8$ W/cm$^2$, spatially (through focusing) and temporally (through pulsing) near a focal point set inside the wafer W. The laser beam of the high peak power density causes a non-linear absorption effect on the wafer W near the focal point, so that the laser beam transmitting through the surface of the wafer W may be absorbed at high absorptivity near the focal point inside the wafer W. Accordingly, high-density defects (for example, a dislocation) may occur in a portion of the wafer W that absorbs the laser beam, and vertical cracks of the wafer W may be easily generated.

The first laser device 200, the second laser device 300, and the third laser device 400 may be different from each other, since each of the laser devices may be configured for a different function. For example, the first laser device 200 may be a laser device for forming the plurality of first grooves GR1 in the wafer W. The second laser device 300 may be a laser device for planarizing the lower surface GR1BS of each of the plurality of first grooves GR1. The third laser device 400 may be a laser device for forming the internal cracks IB inside the wafer W. In one or more embodiments, the same light source (e.g., 210, 310, 410) may be used with different condensation optical systems (e.g., 220, 320, 420) configured to perform a respective one of the functions.

For example, a horizontal condensation area of the first laser beam LB1 of the first laser device 200 may be greater than a horizontal condensation area of the third laser beam LB3 of the third laser device 400. A horizontal condensation area of the second laser beam LB2 of the second laser device 300 may be greater than the horizontal condensation area of the third laser beam LB3 of the third laser device 400. For example, the horizontal condensation areas of the first laser beam LB1 and the second laser beam LB2 may be similar to a horizontal area of each of the plurality of first grooves GR1. A wavelength of the first laser beam LB1 may be shorter than a wavelength of the third laser beam LB3. A wavelength of the second laser beam LB2 may be shorter than the wavelength of the third laser beam LB3.

Accordingly, the first laser device 200 and the second laser device 300 may radiate the first laser beam LB1 and the second laser beam LB2 to a relatively wide horizontal area, respectively, and the third laser device 400 may intensively radiate the third laser beam LB3 to a relatively narrow horizontal area.

In an embodiment of the inventive concept, the plurality of internal cracks IB may be formed inside the wafer W. The plurality of internal cracks IB may be spaced apart from each other in a horizontal direction (X direction and/or Y direction). For example, the plurality of internal cracks IB may have the same horizontal separation distances therebetween and may be arranged inside the wafer W.

In some embodiments, in order to reduce a thickness of the wafer W before the internal crack IB of the wafer W is formed, a pre-grinding process may be performed on the lower surface of the wafer W.

Figure 2E:
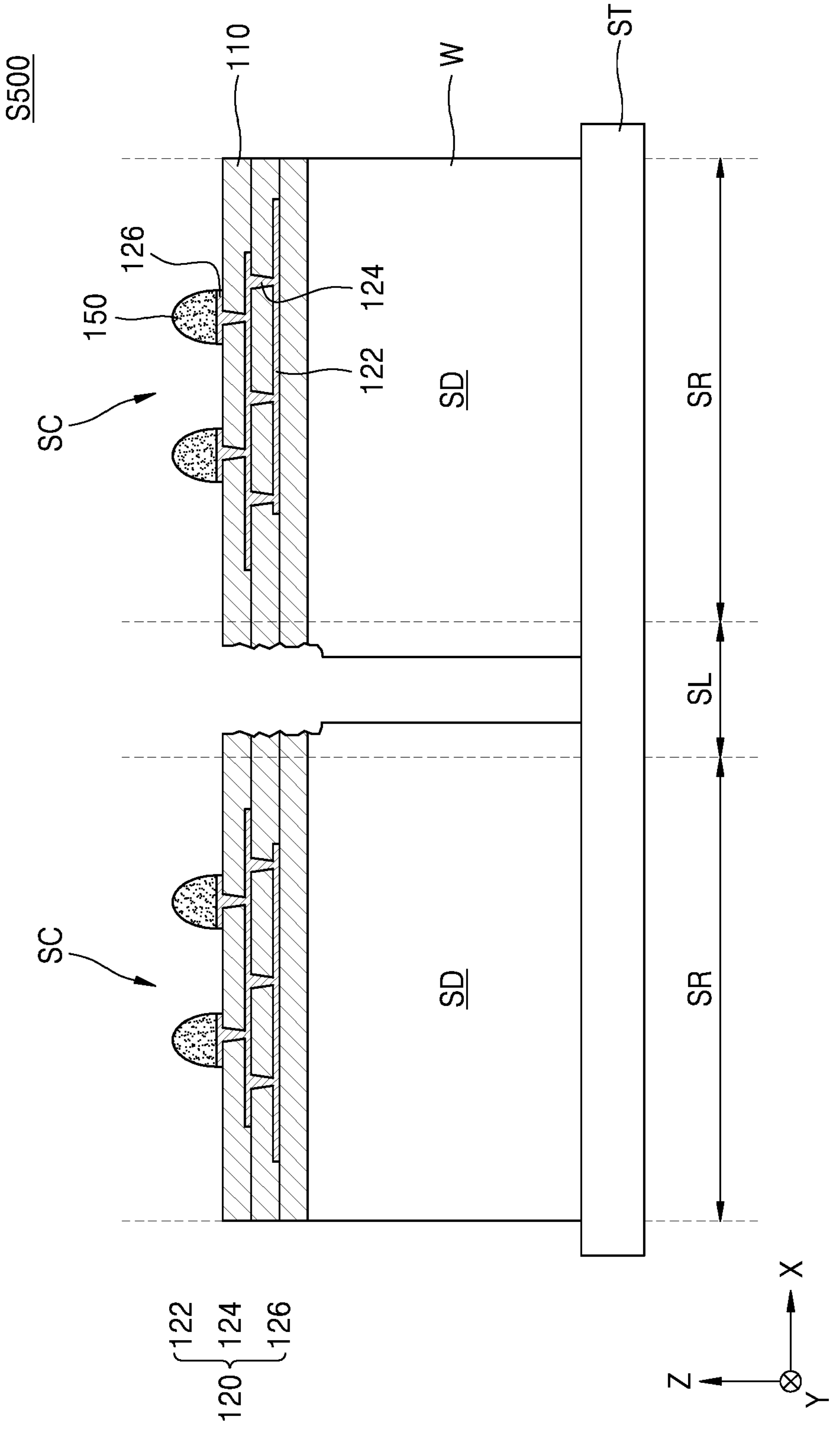

Referring to FIGS. 1 and 2E together, the plurality of semiconductor devices SD may be separated in operation S500. After the wafer W in which the internal crack IB is formed is attached to a dicing tape (not shown), the dicing tape may be stretched outwardly in a horizontal direction (X direction and/or Y direction), which applies an external stress to the wafer W so that the semiconductor devices SD may be separated along the internal crack IB within the scribe lane area SL. A process of separating the semiconductor devices SD by stretching the dicing tape in the horizontal direction (X direction and/or Y direction) may be referred to as a stretching (i.e., expansion) process. In some embodiments, before the dicing tape is attached to the wafer W, a back grinding process for polishing the back surface of the wafer W may be further performed.

The dicing tape may be a film having adhesive force capable of fixing or supporting the wafer W when the wafer W is diced. The dicing tape may include a base film including polymer resin and an adhesive layer provided on one surface of the base film. For example, the base film may include polyvinyl chloride (PVC), polyolefin (PO), polyethylene terephthalate (PET), or the like. In addition, the adhesive layer may include acryl-based resin or the like.

The operation of separating the plurality of semiconductor devices SD may be referred to as the second dicing operation. Through the second dicing operation, the wafer W may be separated into a plurality of wafers W (i.e., singulated dies). In other words, through the second dicing operation, the wafer W may be completely broken. Accordingly, the wafer W and the semiconductor device SD may be separated into a plurality of semiconductor device chips SC.

The wafer W and the semiconductor devices SD may be separated into the plurality of semiconductor device chips SC, and the plurality of semiconductor device chips SC and the dicing tape DT may be separated from each other. For example, when the dicing tape DT includes an ultraviolet irradiation type, ultraviolet (UV) rays may be radiated to lower surfaces of the plurality of semiconductor device chips SC to cure an adhesive layer, thereby reducing adhesive force and peeling off the dicing tape DT from several semiconductor device chips SC.

In another embodiment, the second dicing operation may include at least one of a laser cutting process, a dry etching process, a wet etching process, a plasma process, and a process using a blade.

The semiconductor device SD that is separated may be packaged in operation S600. The packaging process may include a wire bonding process, a molding process, a marking process, a solder ball mounting process, and the like.

Operations S100 to S500 described above may be included in a wafer dicing method. In addition, when the wafer dicing method includes operation S600, the wafer dicing method may be referred to as a method of manufacturing a semiconductor device.

A general wafer dicing method and/or a method of manufacturing a semiconductor device does not include a step of planarizing a lower surface of a plurality of first grooves, and thus, when stealth dicing is performed, it is relatively difficult to focus a laser beam inside a wafer. When stealth dicing is performed in a state in which lower surfaces of a plurality of second grooves are not planarized, the laser beam may be irregularly reflected (e.g., scattered) from the lower surfaces of the plurality of first grooves.

On the other hand, the wafer dicing method and/or the method of manufacturing the semiconductor device according to one or more embodiments of the inventive concept includes an operation of irradiating the lower surfaces GR1BS of the plurality of first grooves GR with a laser beam of the second laser device 300, so as to planarize the lower surfaces GR1BS of the plurality of first grooves GR1 and form the plurality of second grooves GR2. Accordingly, when a stealth dicing process is performed with the third laser device 400 through the lower surfaces GR2BS of the plurality of second grooves GR2 which have been planarized, transmittance of the third laser beam LB3 in the wafer W may increase. Thus, the third laser beam LB3 may be relatively easily focused on a point or region inside the wafer W. In addition, when the stealth dicing process is performed with the third laser device 400 through the lower surfaces GR2BS of the plurality of second grooves GR2, a rate at which irregular reflection of the third laser beam LB3 occurs at the lower surfaces GR2BS of the plurality of second grooves GR2 may decrease. Accordingly, the internal crack IB may be easily formed inside the wafer W.

Figure 3:
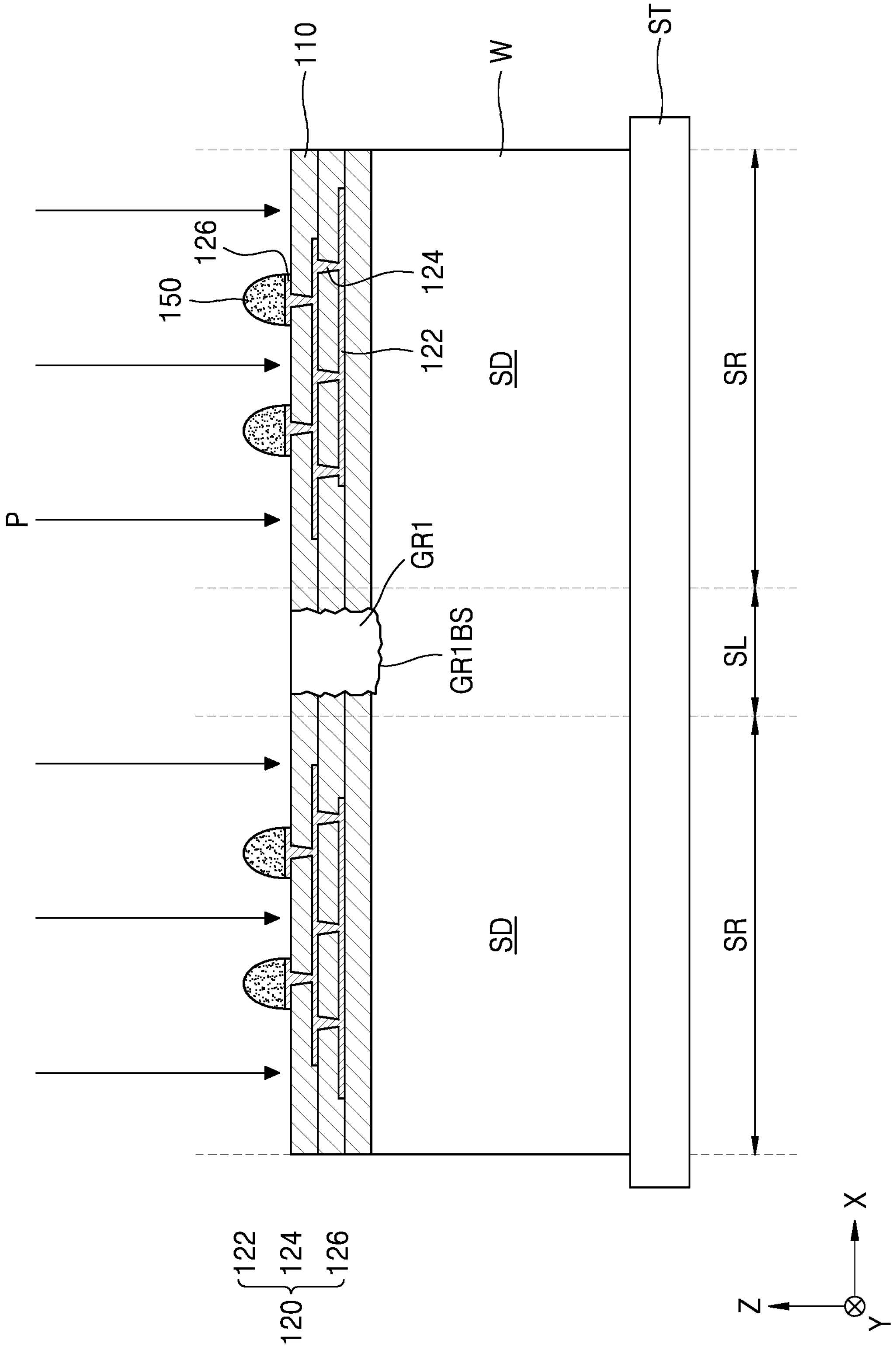
FIG. 3 is a cross-sectional view illustrating an exemplary method of forming a plurality of first grooves in a wafer, according to an embodiment of the inventive concept.

FIG. 3 is a cross-sectional view illustrating an exemplary method of forming a plurality of first grooves in a wafer, according to an embodiment of the inventive concept. FIG. 2B shows a method of forming the plurality of first grooves GR in the wafer W by using the first laser device 200, and FIG. 3 shows an alternative method S200*a* of forming the plurality of first grooves GR1 in the wafer W by using plasma treatment. For convenience of description, in FIG. 3, the scribe lane area SL is arranged only between two semiconductor devices SD.

Referring to FIGS. 1, 2B, and 3, the plurality of first grooves GR1 may be formed in the wafer W (S200*a*). The plurality of first grooves GR1 may be formed in the scribe lane area SL. The plurality of insulating layers 110 and/or at least a portion of the wafer W may be etched by performing plasma etching on the front surface of the wafer W, so that the plurality of first grooves GR1 may be formed. Although not shown, plasma dicing equipment (not shown) may perform plasma etching on the front surface of the wafer W. The plasma dicing equipment may generate plasma from etch gas, and supply the generated plasma P onto the wafer W.

Although not specifically shown in FIG. 3, before the plasma etching is performed, a mask pattern for limiting arrangement locations of the plurality of first grooves GR1 may be formed on the plurality of insulating layers 110, and the mask pattern may be removed after the plasma etching is performed. When the plurality of first grooves GR1 are formed through plasma etching, high etching speed may be implemented while minimizing damage to the scribe lane area SL. In another embodiment, the plurality of first grooves GR1 may be formed by using a dry etching process, a wet etching process, and/or a blade.

Figure 4:
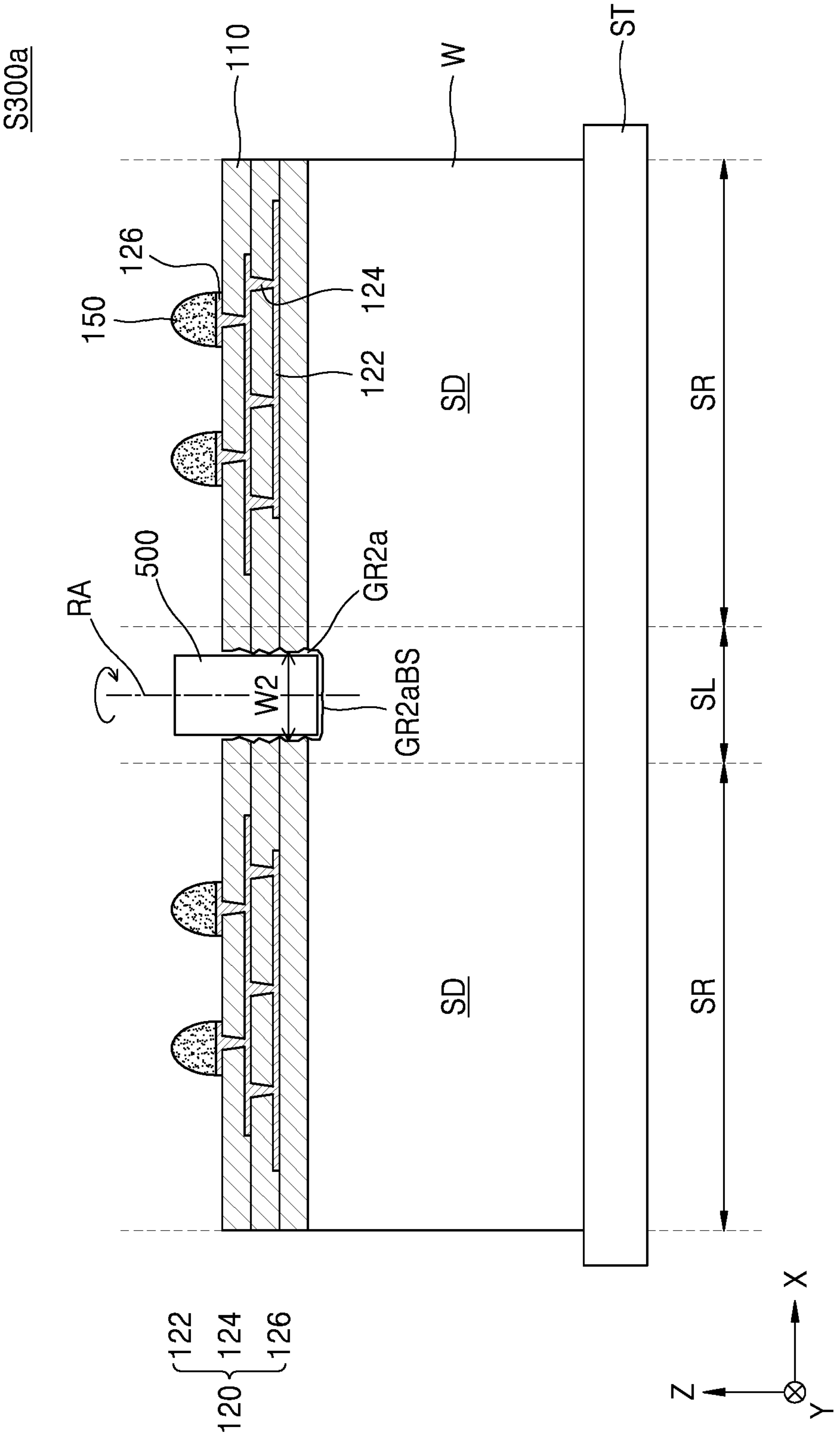
FIG. 4 is a cross-sectional view illustrating an exemplary method of forming a plurality of second grooves in a wafer, according to an embodiment of the inventive concept.

FIG. 4 is a cross-sectional view illustrating an exemplary method of forming a plurality of second grooves in a wafer, according to an embodiment of the inventive concept. FIG. 2C shows a method (S300) of planarizing the lower surfaces GR1BS of the plurality of first grooves GR1 by using the second laser device 300 to form the planarized lower surface GR2BS of the second grooves GR2, and FIG. 4 shows an alternative method S300*a* of planarizing the lower surfaces GR1BS of the plurality of first grooves GR1 on the wafer W by using a polishing apparatus 500 to form a planarized lower surface GR2*a*BS of a plurality of second grooves GR2*a*. For convenience of description, in FIG. 4, the scribe lane area SL is arranged only between two semiconductor devices SD.

Referring to FIGS. 1, 2B, 2C, and 4, the lower surfaces GR1BS of the plurality of first grooves GR1 may be planarized (S300*a*). The lower surfaces GR1BS of the plurality of first grooves GR1 may be planarized by the polishing apparatus 500. For example, the polishing apparatus 500 may include a grinder and/or a CMP apparatus.

In an embodiment of the inventive concept, the polishing apparatus 500 may rotate about a shaft extending in a vertical direction (Z direction) and cut at least a portion of the wafer W. For example, the polishing apparatus 500 may rotate about a shaft extending in the vertical direction (Z direction) and cut the lower surfaces GR1BS of the plurality of first grooves GR1. The polishing apparatus 500 may be coupled to a rotation shaft RA, and may be configured to rotate based on rotation of the rotation shaft RA. In an embodiment, when the polishing apparatus 500 is viewed from a plane (X-Y plane) perpendicular to the vertical direction (Z direction) which is an extension direction of the rotation shaft RA, the polishing apparatus 500 may have a disk shape.

For example, a second width W2, which is a width of each of the plurality of second grooves GR2*a*, may be about 10 micrometers to about 100 micrometers, although embodiments of the present inventive concept are not limited to this specific range of widths. For example, the second width W2 may be greater than or equal to about 70 micrometers. For example, the first width W1 and the second width W2 of FIG. 2B may be different from each other. In another embodiment, the first width W1 and the second width W2 of FIG. 2B may be equal to each other. Each of the plurality of first grooves GR1 may be formed to have a width sufficient for the polishing apparatus 500 to planarize the lower surfaces GR1BS of the plurality of first grooves GR1. In other words, each of the plurality of second grooves GR2*a* may have a width greater than or equal to a horizontal width of the polishing apparatus 500.

Figure 5:
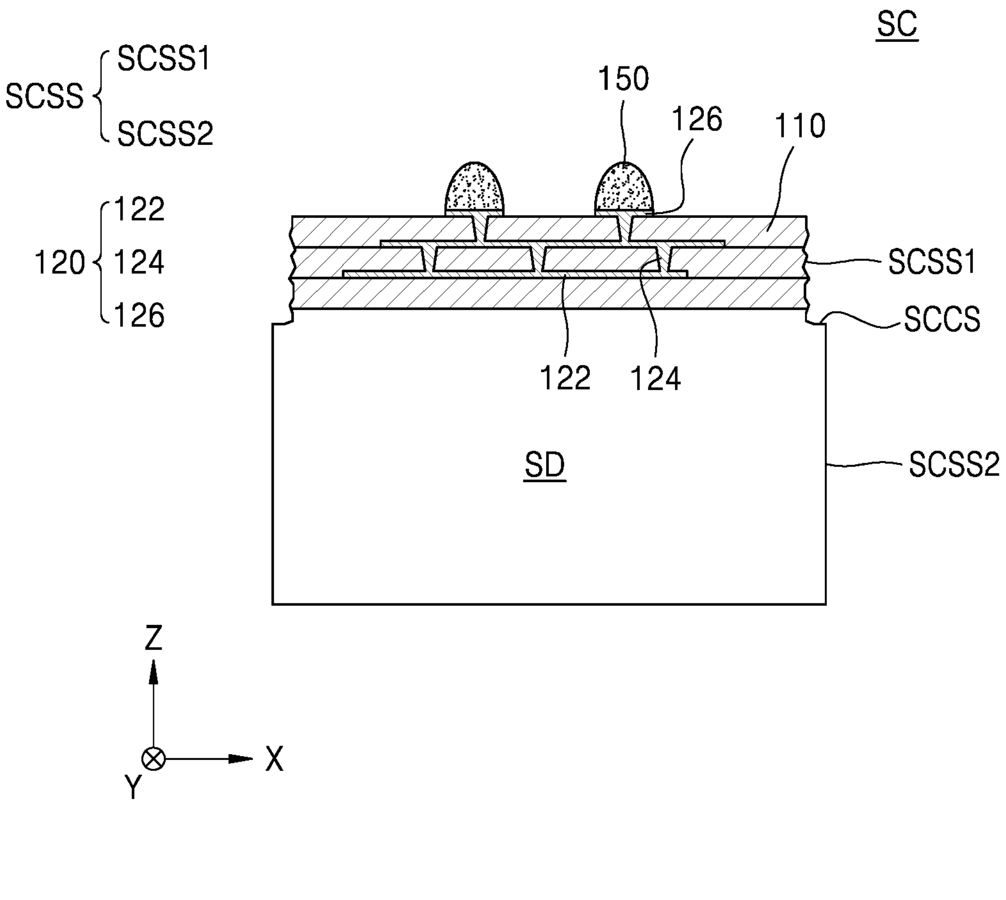
FIG. 5 is a cross-sectional view illustrating a semiconductor device chip formed through a wafer dicing method, according to an embodiment of the inventive concept.

FIG. 5 is a cross-sectional view illustrating a semiconductor device chip formed through a wafer dicing method according to an embodiment of the inventive concept. A description is provided with reference to FIGS. 1 to 4, and the previously described content may be omitted.

Referring to FIG. 5, at least a portion of a side surface SCSS of a semiconductor device chip SC may not be aligned in a vertical direction (Z direction).

The side surface SCSS of the semiconductor device chip SC may include an upper surface SCSS1 and a lower surface SCSS2, which are spaced apart from each other in a horizontal direction (X direction and/or Y direction). In addition, the semiconductor device chip SC may include a connection surface SCCS connecting the upper surface SCSS1 and the lower surface SCSS2 to each other. Each of the upper surface SCSS1 and the lower surface SCSS2 may extend in the vertical direction (Z direction), and the connection surface SCCS may extend in the horizontal direction (X direction and/or Y direction).

For example, the upper surface SCSS1 may be at least a portion of side surfaces of the second grooves GR2 and GR2*a*, the connection surface SCCS may be at least a portion of the lower surfaces GR2BS and GR2*a*BS of the second grooves GR2 and GR2*a*, respectively, and the lower surface SCSS2 may be at least a portion of a broken surface formed by the second dicing process. Accordingly, the upper surface SCSS1 may be referred to as a non-planarization surface, the connection surface SCCS may be referred to as a planarized surface, and the lower surface SCSS2 may be referred to as a stealth dicing surface.

At least a portion of the upper surface SCSS1 may be located at the same vertical level as the insulating layer 110 and the wiring layer 120 (i.e., coplanar), and at least a portion of each of the connection surface SCCS and the lower surface SCSS2 may be located at the same vertical level as the semiconductor device SD. The upper surface SCSS1 may be at least one side surface of each of the insulating layer 110 and/or the wiring layer 120. The connection surface SCCS may be at least a portion of an upper surface of the semiconductor device SD. The lower surface SCSS2 may be at least a portion of a side surface of the semiconductor device SD. The upper surface SCSS1 may be located at a higher vertical level than the lower surface SCSS2.

The upper surface SCSS1, the connection surface SCCS, and the lower surface SCSS2 may have different roughnesses from each other. For example, the roughness of the lower surface SCSS2 may be less ness than each of the roughness of the upper surface SCSS1 and the roughness of the connection surface SCCS. In addition, the roughness of the connection surface SCCS may be less than or equal to the roughness of the upper surface SCSS1. For example, the roughness (Ra) of the connection surface SCCS may be less than or equal to about 0.08 micrometers, and the roughness (Ra) of the lower surface SCSS2 may be less than or equal to about 0.01 micrometers.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as "above," "below," "upper" and "lower" may be used herein to indicate a position of elements, structures or features relative to one another as illustrated in the figures, rather than absolute positioning. Thus, the semiconductor device may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

While the inventive concept has been particularly shown and described with reference to embodiments thereof, it will be understood that various changes in form and details may be made therein without departing from the spirit and scope of the following claims.

What is claimed is:

1. A wafer dicing method, comprising:

preparing a wafer having a plurality of device formation areas and a scribe lane area between the plurality of device formation areas;

forming a plurality of semiconductor devices in the respective plurality of device formation areas of the wafer;

forming, in the scribe lane area, a plurality of first grooves partially passing through at least a portion of the wafer in a vertical direction;

forming a plurality of second grooves by planarizing lower surfaces of the plurality of first grooves;

forming one or more internal cracks in the wafer by radiating a laser beam along lower surfaces of the plurality of second grooves; and separating the plurality of semiconductor devices from each other along the one or more internal cracks.

2. The wafer dicing method of claim 1, wherein the planarizing of the lower surfaces of the plurality of first grooves comprises configuring the lower surface of each of the plurality of first grooves to have a roughness of less than or equal to about 0.08 micrometers.

3. The wafer dicing method of claim 1, wherein the forming of the plurality of first grooves in the scribe lane area comprises performing a laser etching method or a plasma etching method.

4. The wafer dicing method of claim 1, wherein the planarizing of the lower surfaces of the plurality of first grooves comprises performing a laser etching method or a chemical mechanical polish (CMP) method.

5. The wafer dicing method of claim 1, wherein a first laser beam for planarizing the lower surfaces of the plurality of first grooves has a different wavelength and irradiation area relative to a second laser beam for forming the one or more internal cracks.

6. The wafer dicing method of claim 1, wherein the planarizing of the lower surfaces of the plurality of first grooves comprises removing at least a portion of the wafer in a vertical direction by greater than or equal to about 1 micrometer.

7. The wafer dicing method of claim 1, wherein a range of a width of each of the plurality of second grooves in a horizontal direction is from about 10 micrometers to about 100 micrometers.

8. A method of manufacturing a semiconductor device, the method comprising:

preparing a wafer having a plurality of device formation areas and a scribe lane area between the plurality of device formation areas;

forming a plurality of semiconductor devices in the plurality of device formation areas of the wafer;

forming a plurality of insulating layers and a wiring layer on the wafer;

forming, in the scribe lane area, a plurality of first grooves partially passing through at least a portion of the wafer in a vertical direction;

forming a plurality of second grooves by planarizing lower surfaces of the plurality of first grooves;

forming one or more internal cracks in the wafer by radiating a laser beam along lower surfaces of the plurality of second grooves;

separating the plurality of semiconductor devices from each other along the one or more internal cracks; and packaging each of the plurality of semiconductor devices responsive to the separating, wherein the plurality of first grooves pass through at least one of the plurality of insulating layers and the wiring layer in the vertical direction.

9. The method of claim 8, wherein the planarizing of the lower surfaces of the plurality of first grooves comprises performing planarizing by at least a portion of a polishing apparatus having a rotation shaft in the vertical direction rotating inside the plurality of first grooves.

10. The method of claim 8, wherein the plurality of second grooves and the one or more internal cracks respectively overlap each other in the vertical direction.

11. The method of claim 8, wherein the lower surfaces of the plurality of second grooves and the one or more internal cracks are spaced apart from each other in the vertical direction.

12. The method of claim 8, wherein the separating of the plurality of semiconductor devices comprises:

attaching a dicing tape onto a back surface of the wafer; and stretching the dicing tape in a horizontal direction.

13. The method of claim 8, wherein strengths of the plurality of insulating layers are less than a strength of the wafer.

14. The method of claim 8, further comprising grinding a back surface of the wafer before the forming of the one or more internal cracks in the wafer.

15. The method of claim 8, further comprising grinding a back surface of the wafer after the forming of the one or more internal cracks in the wafer.

16. A method of manufacturing a semiconductor device, the method comprising:

preparing a plurality of device formation areas and a scribe lane area between the plurality of device formation areas on a wafer;

forming a plurality of semiconductor devices in the plurality of device formation areas of the wafer;

forming a plurality of insulating layers and a wiring layer on the wafer;

forming, in the scribe lane area, a plurality of first grooves partially passing through at least a portion of the wafer in a vertical direction;

forming a plurality of second grooves by planarizing lower surfaces of the plurality of first grooves;

forming one or more internal cracks in the wafer by irradiating the scribe lane area with a laser beam along lower surfaces of the plurality of second grooves;

separating the plurality of semiconductor devices from each other along the one or more internal cracks; and packaging each of the plurality of semiconductor devices responsive to the separating, wherein the forming of the plurality of first grooves in the scribe lane area comprises performing at least one of a laser etching method using a first laser device, and a plasma etching method, the planarizing of the lower surfaces of the plurality of first grooves comprises performing at least one of a laser etching method using a second laser device, and a chemical mechanical polish (CMP) method, the forming of the one or more internal cracks comprises performing a laser etching method using a third laser device, and the plurality of first grooves pass through at least one of the plurality of insulating layers and the wiring layer in the vertical direction.

17. The method of claim 16, wherein the forming of the plurality of first and second grooves comprises using the first and second laser devices, respectively, to etch at least a portion of each of the plurality of insulating layers or the wafer, and the forming of the one or more internal cracks comprises using the third laser device to reform at least a portion of the wafer by irradiating a laser beam to an area inside of the wafer.

18. The method of claim 16, wherein an irradiation range of a laser beam generated by the second laser device is wider than an irradiation range of the laser beam generated by the third laser device.

19. The method of claim 16, wherein a wavelength of a laser beam generated by the second laser device is shorter than a wavelength of a laser beam generated by the third laser device.

20. The method of claim 16, wherein forming the plurality of second grooves comprises forming the lower surface of each of the plurality of second grooves to have a surface roughness of less than or equal to about 0.08 micrometers, and a range of a horizontal width of each of the plurality of second grooves from about 60 micrometers to about 100 micrometers.

* * * * *